Figure 4:
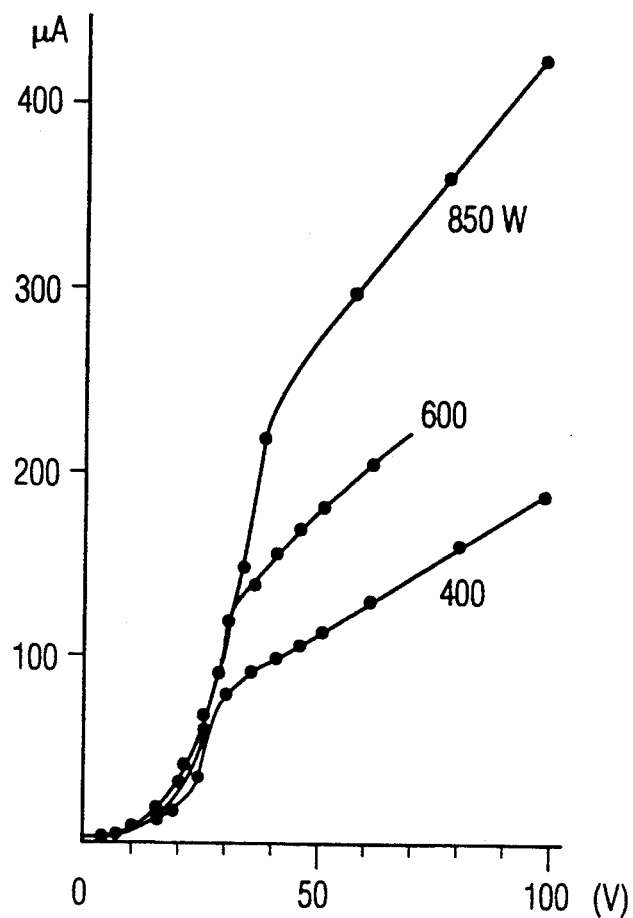

United States Patent [19]
Visser et al.

[11] Patent Number: 5,310,703
[45] Date of Patent: May 10, 1994

[54] METHOD OF MANUFACTURING A SEMICONDUCTOR DEVICE, IN WHICH PHOTORESIST ON A SILICON OXIDE LAYER ON A SEMICONDUCTOR SUBSTRATE IS STRIPPED USING AN OXYGEN PLASMA AFTERGLOW AND A BIASED SUBSTRATE

[75] Inventors: Jan Visser, Eindhoven; Lukas De Boer, Nijmegen, both of Netherlands

[73] Assignee: U.S. Philips Corporation, New York, N.Y.

[21] Appl. No.: 833,570

[22] Filed: Feb. 7, 1992

Related U.S. Application Data

[63] Continuation of Ser. No. 520,982, May 7, 1990, abandoned, which is a continuation of Ser. No. 272,665, Nov. 17, 1988, abandoned.

[30] Foreign Application Priority Data

Dec. 1, 1987 [NL] Netherlands .................. 8702875

[51] Int. Cl.$^5$ ............. H01L 21/00; H01L 21/02; H01L 21/312; H01L 21/471
[52] U.S. Cl. ..................... 437/229; 437/225; 156/643; 156/659.1
[58] Field of Search ............ 437/225, 229; 156/643, 156/646, 659.1

[56] References Cited

U.S. PATENT DOCUMENTS

| | | | |
|---|---|---|---|
| 3,271,286 | 9/1966 | Lepselter | 204/192.55 |
| 3,951,843 | 4/1976 | Jacob | 252/172 |
| 4,349,409 | 9/1982 | Shibayama et al. | 204/192.32 |
| 4,572,759 | 2/1986 | Benzing | 118/620 |
| 4,673,456 | 6/1987 | Spencer et al. | 156/643 |
| 4,687,544 | 8/1987 | Bersin | 156/646 |

FOREIGN PATENT DOCUMENTS

| | | |
|---|---|---|
| 0098828 | 7/1980 | Japan . |
| 0128830 | 10/1980 | Japan . |
| 0103419 | 8/1981 | Japan . |
| 0052639 | 3/1983 | Japan . |
| 0086224 | 5/1984 | Japan . |
| 0220926 | 12/1984 | Japan . |
| 0170941 | 9/1985 | Japan . |
| 0046951 | 3/1986 | Japan . |
| 0059338 | 3/1986 | Japan . |
| 0272539 | 11/1987 | Japan ................... 437/229 |

OTHER PUBLICATIONS

Chapman, B., Plasma Etching of a Positively Biased Wafer, IBM Tech. Disclos. Bull., vol. 22, No. 3, Aug. 1979, pp. 1175-1176.
Wolf, S., Silicon Processing for the VLSI Era, vol. 1, pp. 357-361 and Chap. 16, Lattice Press, 1986.
Sze, S., VLSI Technology, Chap. 8, McGraw-Hill, 1983.
Ghandhi, S., VLSI Fabrication Principles, Chap. 9, Wiley & Sons, 1983.

*Primary Examiner*—Brian E. Hearn
*Assistant Examiner*—B. Everhart
*Attorney, Agent, or Firm*—Paul R. Miller

[57] ABSTRACT

During the manufacture of a semiconductor device in a semiconductor substrate, masks of photoresist are used for selecting given regions to be processed. This photoresist is stripped by subjecting the semiconductor substrate in a processing chamber to an oxygen-containing plasma after-glow, that is passed over the photoresist. In order to limit the penetration of inorganic contaminations released from the photoresist into the silicon oxide layer of the semiconductor substrate, according to the invention, the semiconductor substrate is connected via a first electrode to the positive terminal and via a second electrode arranged at a certain distance therefrom in the processing chamber to the negative terminal of an electric supply source in such a manner that an electrical field is adjusted between the silicon oxide layer and the plasma. The second electrode may be the electrically conducting wall of the processing chamber.

11 Claims, 2 Drawing Sheets

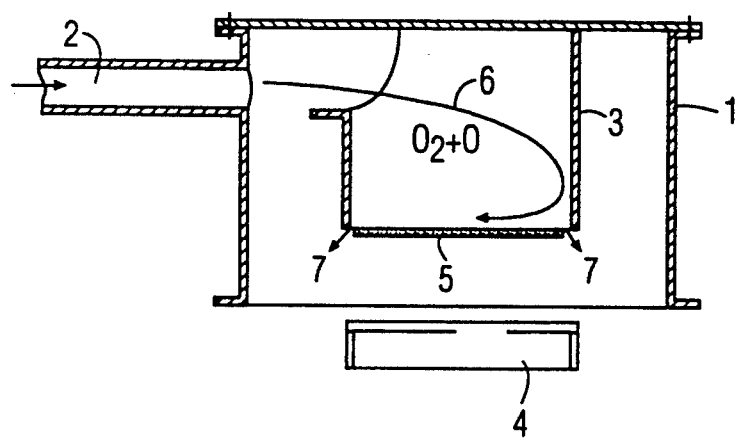
FIG. 1
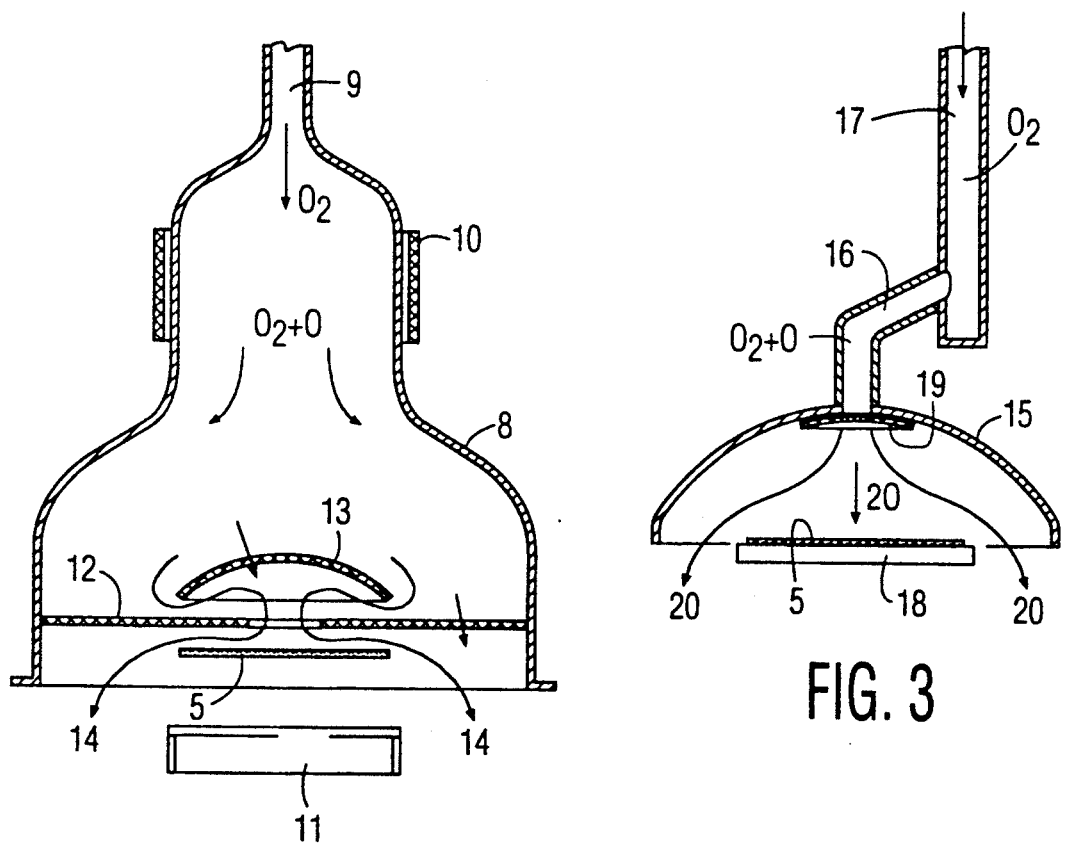
FIG. 2
FIG. 3

METHOD OF MANUFACTURING A SEMICONDUCTOR DEVICE, IN WHICH PHOTORESIST ON A SILICON OXIDE LAYER ON A SEMICONDUCTOR SUBSTRATE IS STRIPPED USING AN OXYGEN PLASMA AFTERGLOW AND A BIASED SUBSTRATE

This is continuation of application Ser. No. 07/520,982 filed May 7, 1990 now abandoned, which is a continuation of Ser. No. 07/272,665, filed Nov. 17, 1988 now abandoned.

The invention relates to a method of manufacturing a semiconductor device, in which photoresist on a silicon oxide layer on a semiconductor substrate is stripped in that the semiconductor substrate is subjected in a processing chamber to an oxygen-containing plasma, which is passed over the photoresist. A method of this kind is known in practice.

For the manufacture of semiconductors, for example, in an N- or a P-doped silicon substrate, as is known, a comparatively large number of different processing steps are necessary in practice, among which are included the step of providing one or more oxide layers on the silicon substrate, the step of forming in the oxide layers a pattern of openings at which the individual semiconductors are located, the step of providing the desired doping layers, the step of contacting and interconnecting the various semiconductors, etc.

Since it must be possible to provide different kinds of semiconductors and/or similar semiconductors having relatively different properties in the same substrate, it is common practice to select by means of a photoresist mask the regions of the substrate to be subjected to a given processing step. For this purpose, the substrate is coated with a layer of photoresist, which is prepared by illumination, for example, with ultraviolet light in such a manner that a masking layer of photoresist corresponding to the regions to be processed is obtained. Subsequently, the photoresist on the regions of the substrate to be processed is removed in a development apparatus. After the desired processing step, for example the step of etching a pattern of openings into an oxide layer, has been carried out, the remaining part of the photoresist still present on the substrate should be stripped so that, for example, a fresh mask of photoresist can be provided again.

For stripping the remaining photoresist, in practice the method mentioned in the opening paragraph is used, for which recently so-called "single wafer" apparatuses have been marketed, in which a single semiconductor wafer is subjected in a processing chamber to an oxygen-containing plasma of low energy, which reacts with the photoresist (oxidation reaction). The ions in this plasma have an energy of about 1 to 2 eV.

It is known from U.S. Pat. No. 3,951,843 that with a similar plasma reaction in an apparatus of the so-called "Barrel" type, in which several (fifty) semiconductor wafers are processed at a time, inorganic elements present in the photoresist are not removed, while especially the released very mobile alkali metals readily diffuse into the silicon oxide layer and may lead to an erroneous operation of the ultimate semiconductor device. MOS (Metal-oxide-silicon) structures, such as MOS transistors having an undesired degree of contamination of this type, will operate insufficiently in electric circuits because their transient voltage then exceeds the design criteria.

A known method of demonstrating and quantizing the degree of contamination in an oxide layer on a semiconductor substrate consists in determining the shift in the so-called flat band voltage of the capacitance versus voltage curve (C-V) for a MOS capacitor of the kind described inter alia in "Applications of Reactive Plasma Practical Microelectronic Processing Systems", by R. L. Maddox and H. L. Parker in "Solid State Technology", April 1978, pp. 107–113.

Contaminations in the oxide layer in fact influence the capacitance of the capacitor as a function of the voltage applied across it. The shift of the flat band voltage, also designated as C-V shift value, is then defined as the voltage at which the contaminated capacitor attains the same capacitance value as a non-contaminated capacitor at 0 V. A C-V shift value high in the absolute sense indicates an undesired degree of contamination.

After C-V measurements on silicon semiconductor slices provided with an oxide layer where the photoresist was stripped in a "single wafer" apparatus, it was found that an undesired degree of contamination had occurred in the oxide layer. In order to reduce the degree of contamination of the semiconductor wafer due to the processing in a "single wafer" apparatus, a series of measures is conceivable.

The possibility of reducing the plasma flow rate in order to thus diminish any damage of the semiconductor wafer due to particles from the plasma striking it is limited by the requirement that the processing rate of the apparatus must be such that it must be possible to use this apparatus in combination with various other apparatuses for other processing steps. Preferably, this processing rate should be of the order of sixty slices per hour. The screening of the semiconductor wafer from the plasma is limited by the requirement that the flow of plasma should be directed as far as possible over the surface of the semiconductor slice in order to ensure that the smallest possible quantity of oxygen-containing plasma is lost before it can react with the photoresist, that is to say is drained from the processing chamber. The use of a given photoresist, which contains only a very small degree of contamination, is disadvantageous from the viewpoint of manufacturing and cost because it involves a limitation of the choice of the kind of photoresist.

The problem to be solved by the invention therefore requires to provide such a measure that the degree of undesired contamination of silicon oxide with inorganic elements when stripping photoresist by means of an oxygen-containing plasma in a "single wafer" apparatus can be limited and that the overall processing time is not or substantially not lengthened thereby.

It has been found that the degree of undesired contamination can thus be effectively limited in that the semiconductor substrate is connected via a first electrode to the positive terminal and a second electrode arranged at a certain distance therefrom in the processing chamber is connected to the negative terminal of an electric source of supply, as a result of which an electric field is adjusted between the layer of silicon oxide and the plasma.

Measurements of the C-V shift values of semiconductor wafers, which are processed according to the invention under different processing conditions (plasma pressure, plasma density, processing time), have shown that with a suitable choice of the strength of the electric field the voltage shift and hence the degree of undesired contamination can be reduced, the processing rate of the "single wafer" apparatus being not or substantially not influenced by the applied electric field.

The measure according to the invention is surprising in that in spite of the low energy (1 to 2 eV) of the charged particles in the plasma these particles nevertheless probably influence the incorporation of contaminations of the photoresist into the silicon oxide. Although the mechanism of the penetration of contaminations into the silicon oxide is still not sufficiently known, it is believed that inter alia the very mobile sodium atoms penetrate together with positive plasma particles into the silicon oxide. The influence of electrons and negative ions of the plasma seems to be small.

The measure according to the invention is superior to the measure known from U.S. Pat. No. 3,951,843 to render the inorganic contaminations less mobile by the addition of a gas mixture of organic halides, such as chlorine and/or fluorine or fluorine-bromine combinations not only due to its simplicity, but also due to the fact that this known measure cannot be used during a large number of processing steps for manufacturing a semiconductor device because, for example, fluorine has an etching effect on polysilicon.

According to the preferred embodiment of the invention, the electric field is applied where the first electrode is connected to the side of the semiconductor substrate not coated with photoresist. The current consequently flowing in the semiconductor substrate or in the semiconductor layers formed therein is then limited by the plasma in the processing chamber, which acts as a current limiter due to the low energy of the charged particles (1 to 2 eV). This means that the measure according to the invention can be used during each processing step of the semiconductor device, in which photoresist has to be stripped, without the risk of breakdown in the various substrate layers.

In "single wafer" apparatuses known in practice, the substrate is arranged within an electrically conducting processing chamber so as to be supported in an electrically floating manner. An advantageous embodiment of the method according to the invention is characterized in that the second electrode is the electrically conducting wall of the processing chamber, to which the negative terminal of the electric supply source is connected.

The intrinsic breakdown value of, for example, a pure non-crystalline silicon oxide layer is of the order of 7–9 MV/cm. When the field strength in the oxide layer exceeds its breakdown value, the electric current through the substrate and the oxide layer strongly increases. It has been found that satisfactory results are obtained if in accordance with the method of the invention a field strength of 4–8 MV/cm is established in the oxide layer, which means that the electric field across the oxide may be lower than the intrinsinc breakdown value thereof.

In the known "single wafer" apparatuses, the photoresist is not stripped uniformly. In order to be sure that the photoresist is stripped at all desired areas on the semiconductor wafer, in practice a given overprocessing time is taken into account for which the electric field according to the invention should be maintained. Since the inorganic contaminations in the photoresist are not removed, as already indicated above, by the plasma and consequently remain in part on the semiconductor substrate, a still further embodiment of the invention is characterized in that the electric supply source is only switched off after all plasma particles have been removed from the processing chamber at the end of the manufacture. Thus, it is prevented that any plasma particles still present in the processing chamber can lead as yet to contamination of the semiconductor substrate after the supply of plasma has been stopped.

It should be noted that it is known per se to apply an electric potential to the semiconductor substrate, for example, in order to bring about in etching processes an increase of the etching rate. It is further also known to apply a voltage to a semiconductor substrate, which is subjected to a plasma, in which the particles have a comparatively high energy, in order to decrease the speed of the ions striking the semiconductor substrate, for example, so as to permit control of the rate at which the substrate is etched.

Figure 5:
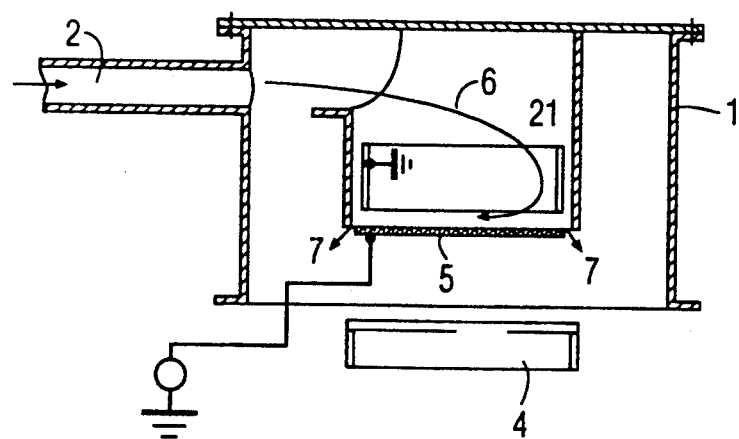

The invention will now be described more fully, by way of example, with reference to test results obtained by processing silicon semiconductor wafers in "single wafer" apparatuses and with reference to the drawings. In the drawings:

FIGS. 1, 2, and 3 show diagrammatically embodiments of commercially available "single wafer" apparatuses;

FIG. 4 shows a graph of the current flowing through a silicon substrate not coated with photoresist and through the plasma at different plasma densities as a function of an electric voltage applied between the unprocessed side of the silicon substrate and the processing chamber of a "single wafer" apparatus, and FIG. 5 shows diagrammatically a possible embodiment of the method according to the invention in a "single wafer" apparatus as shown in FIG. 1.

The embodiment of a "single wafer" apparatus shown in FIG. 1 comprises a processing chamber 1,, an inlet 2, a focusing element 3 and a heating element 4. The focusing element 3 consists of a short cylinder, which is vertically secured to the upper wall of the processing chamber 1 and extends therein to just above the area at which a semiconductor wafer 5 is arranged above the heating element 4. On the side of the inlet 2, the focusing element 3 is open so that the oxygen-containing plasma supplied through the inlet 2 to the evacuated processing chamber 1 via the focusing element 3 is passed over the side of the semiconductor wafer 5 to be processed. The arrow 6 diagrammatically indicates the direction in which the plasma flows over the semiconductor wafer. The arrows 7 indicate the direction in which the consumed plasma used is removed from the processing chamber 1. For the sake of simplicity, the means for producing the plasma, for removing the consumed plasma and the means for establishing a vacuum in the processing chamber are not shown.

FIG. 2 shows another type of "single wafer" apparatus comprising a bell-shaped processing chamber 8 widening towards the end, an inlet 9 provided at the narrow upper side thereof and an electrical coil 10. In the lower wide part of the processing chamber 8 is arranged a heating element 11 for heating a semiconductor wafer 5 arranged above it. Respective screening means 12, 13 for screening the side of the semiconductor wafer 5 to be processed from the oxygen-containing plasma are arranged above the semiconductor wafer 5 in the widened part of the processing chamber 8. The plasma is produced by subjecting oxygen gas flowing from the inlet 9 into the processing chamber by means of the coil 10 to a high-frequency (HF) electrical field (10–20 MHz). The distance between the semiconductor wafer 5 and the narrow part of the processing chamber 8, in which the H.F. coil 10 is provided, is such that the semiconductor wafer is located in the so-called afterglow of the H.F. oxygen gas discharge, in which the ions have an energy of 1 to 2 eV. The flow of plasma over the surface of the semiconductor wafer to be processed is indicated by arrows 14. Like in the apparatus shown in FIG. 1, and also in this case the means for draining the consumed plasma and the means for establishing a vacuum in the processing chamber are not shown for the sake of clarity.

FIG. 3 shows diagrammatically a still further embodiment of a "single wafer" apparatus comprising a processing chamber 15, on whose upper side the plasma produced in the discharge space 17 by H.F. oxygen gas discharge is supplied via an inlet 16 to the semiconductor wafer 5 arranged on a heating table 18. As shown, screening means 19 can also be arranged in the processing chamber 15 in front of the inlet 16. In contrast with the apparatuses shown in FIGS. 1 and 2, in this embodiment the plasma arrives substantially perpendicularly on the side of the semiconductor wafer 5 to be processed, as indicated by the arrows of flow 20.

Suitable materials for the manufacture of the processing chambers, screening means and/or focusing means are inter alia quartz and aluminium oxide, which have a very low recombination coefficient for atomic oxygen.

With the apparatuses shown in FIGS. 1 and 2, a large number of experiments were carried out with N-doped silicon slices with a thermal oxide layer formed on one side thereof and having a thickness of 55 nm. Taking into account the parameter adjustments recommended by the respective manufacturers, different silicon wafers coated with a 3 μm thick layer of photoresist of the type Waycoat 710 were subjected to the plasma for different periods of time. The measured C-V shift values at the center of the semiconductor wafer are stated in Table 1. The percentages of overetching and underetching, respectively, are related to the terminal point, i.e. the etching time, after which the whole quantity of photoresist has been removed.

TABLE 1

| C-V shift in Volt | Apparatus of FIG. 1 | Apparatus of FIG. 2 |
|---|---|---|
| Terminal point | −2.56 | −2.93 |
| % overetching |  |  |
| 20 | −1.79 |  |
| 30 |  | −3.24 |
| 100 |  | −3.4 |
| 120 | −3.23 |  |
| 200 | −2.88 | −2.3 |
| % underetching: |  |  |
| 20 | −1.8 | −3.0 |
| 40 | −0.089 |  |
| 60 | −0.067 |  |

In order to examine the influence of any contaminations in the plasma or the processing chamber, also a silicon wafer without photoresist was etched for a time corresponding to a 20% overetching, the measured C-V shift values for the apparatuses of FIGS. 1 and 2 being −0.03 V and −0.04 V, respectively. Stripping of the photosensitive material in an apparatus of the "Barrel" type with 20% over-etching yielded C-V shift values of −0.04 and −0.27 V, respectively.

The results in Table 1 show a considerable C-V shift for all silicon wafers from 20% underetching when being processed in the examined "single wafer" apparatuses. Acceptably low values (±0.5 V) were measured only for processing times considerably below the terminal point time. Since the wafers without photoresist do not exhibit high C-V shift values, it may be concluded that the plasma and the processing chamber are "clean" and that the instability effects found are therefore connected with the photoresist. Since the various tests were of course carried out with different semiconductor wafers, the measuring results inevitably show a certain extent of spread.

It should be noted that in the "single wafer" apparatus shown in FIGS. 1 and 2 the photoresist is stripped non-uniformly. Since on certain regions of the photosensitive wafer the photoresist is stripped more rapidly, these regions are overetched more strongly than other regions on the semiconductor wafer. Measurements have shown that in the apparatus shown in FIG. 1 C-V shift values varying from −2.09 to −6.56 V occurred on the same wafer.

Experiments carried out with lower parameter adjustments than the adjustment values recommended by the manufacturers of the "single wafer" apparatuses also resulted in comparatively high C-V shift values of the order of −3 V. Experiments with different kinds of photoresist yielded different C-V shift values, it is true, but all these values were also not usable for practical applications.

The C-V measurements were carried out in the same test procedure, in which, after suitable aluminium electrodes had been provided on either side of the semiconductor substrate, an alternating voltage having a frequency of 1 MHz and an increase in inclination of 560 mV per second with a pre-adjustment direct voltage of ±20 V was applied. Beforehand, two respective voltage gradients having different polarities, which caused a field strength of 1 MV/cm in the oxide, were applied for 3 minutes at a substrate temperature of 300° C.

In order to examine the influence of the electrical field to be applied according to the invention, the positive terminal of a direct voltage source was connected to side not to be processed (back side) of a silicon substrate which is coated on the side to be processed entirely with a layer of photoresist of 1.8 μm thickness and the negative terminal of the source was connected to the processing chamber, while the voltage of this source lying between ±100 V could be varied. For the time in which the 55 nm thick oxide layer on the silicon substrate was still entirely coated with photoresist, no passage of current through the substrate was measured (measuring range 1–500 μA). According as a larger quantity of photoresist was stripped as a result of the plasma reaction, the electron current strength increased with a sufficiently high voltage and this strength remained from the terminal point at a substantially constant value. Since with a substrate coated with photoresist no current was measured, it may be concluded that only the front side of the semiconductor wafer is subjected to the plasma afterglow and that its back side is situated in a region with substantially stationary flow.

The current-voltage characteristic curve of a silicon substrate with oxide layer without photoresist is shown in FIG. 4 for H.F. powers of 850, 600 and 400 W. The higher the H.F. power, the higher is the density of the plasma (a larger number of charged particles per unit volume). A reduction of the H.F. power results in lower currents. The measuring results clearly show that the afterglow comprises such a number of charged particles that an ion and electron current of resonable strength can flow through the substrate. The kink in the curves at about 30 V is not caused by the plasma, but is due to a change of the conduction mechanism through the oxide layer. At ±30 V, the electrical field in the oxide layer is approximately 6 MV/cm. This electrical field strength very closely approaches the intrinsinc breakdown value of pure non-crystalline silicon.

The measuring results shown in FIG. 4 are surprising because in spite of the fact that the semiconductor wafer is subjected to a plasma of low energy nevertheless a high ion/electron flux was measured in the plasma. It is assumed that the ions striking the oxide layer may lead to defects in the form of channels, as a result of which mobile ions can penetrate very rapidly. The saturation in the C-V shift values ensuing from Table 1 is not in contrast with this conclusion. With lower overetching times, the number of defects will exceed the number of sodium atoms available, but because the quantity of sodium in the photoresist is limited, a given saturation level will occur. In fact, the saturation in the C-V shift values is a measure for the quality of the photoresist.

According to the invention, where the electrical field is applied by connecting the back side of the silicon substrate to the positive terminal and to the processing chamber the negative terminal of a continuous direct voltage source, a number of N-doped silicon substrates with a 55 nm thick oxide layer coated with a 3 μm thick layer of waycoat 710 resist are processed in a "single wafer" apparatus. The C-V shift values found for different voltage values and relatively different gas flow densities are indicated in Table 2.

TABLE 2

| Applied voltage in Volt | C-V shift value in Volt | |
| --- | --- | --- |
| | oxide subjected to higher gas flow rates | oxide subjected to lower gas flow rates |
| −10 | −10 | −10 |
| +10 | −10 | +0.11 |
| +40 | 0.12 | 0.19 |
| +100 | 0.43 | 0.05 |

A comparison of the C-V shift values indicated in Table 2 after stripping of the photoresist by means of the method according to the invention and the photoresist layer stripped by means of the known method in a "single wafer" apparatus as indicated in Table 1 shows that by means of the method according to the invention considerably better C-V shift values are obtained with an applied voltage of +40 V, which corresponds to a field strength of about 7 MV/cm in the oxide layer. The results both for the higher and the lower gas flow rates lie within the acceptable level of ±0.5 V. Besides the small incorporation of contaminations, the method according to the invention has the advantage that the processing rate of the known "single wafer" apparatuses is not or substantially not influenced thereby.

Instead of applying a voltage between the semiconductor substrate and the processing chamber, the electrical field according to the invention may of course also be obtained by applying a voltage between the semiconductor substrate and one or more electrodes arranged in the processing chamber. In FIG. 5, starting from the apparatus shown in FIG. 1, electrodes 21 are arranged in the processing chamber above the side of the semiconductor wafer 5 to be processed. A direct voltage source 22 is connected between these electrodes 21 and the side of the semiconductor wafer 5 not to be processed. The electrodes 21 may take a great variety of forms and may be, for example, one or more electrically conducting plates, an electrically conducting cylinder, etc. As a matter of course, the direct voltage source 22 may also be connected between the semiconductor wafer 5 and the focusing element 3 (FIG. 1) or the screening means 12, 13 (FIG. 2), or the screening means 19 (FIG. 3) or the processing chamber.

Since the semiconductor wafers will generally be processed in an automatized procedure, it is necessary to apply the electrical field according to the invention at least from the instant at which the oxide layer or the semiconductor substrate is subjected to action by the plasma. It is then recommended to apply the field already before the plasma is supplied and to maintain it at least until all the charged plasma particles are removed from the processing chamber in order to be sure that no remaining charged particles can reach the semiconductor substrate and it is excluded that as yet undesired contaminations can penetrate into the silicon oxide.

As a matter of course, the invention is not limited to the application of an electrical field of constant value, but, for example, use may also be made of an electrical field increasing towards the end of the processing or an electrical field may be produced by the application of a direct voltage with an alternating voltage component superimposed on it.

It stands to reason that the invention is not limited to the embodiment described, but that many variations are possible for a person skilled in the art without departing from the scope of the invention.

What is claimed is:

1. In a method of manufacturing a semiconductor device having a layer of silicon oxide provided on a surface of a semiconductor substrate and a photoresist provided over said layer of silicon oxide in a processing chamber, the method of limiting contamination of said layer of silicon oxide by carrying out the steps comprising (a) connecting a first electrode to another surface of the semiconductor substrate, said first electrode being connected to a positive terminal of an electrical source, (b) arranging a second electrode in the processing chamber at a distance from the photoresist, said second electrode being connected to a negative terminal of said electrical source, (c) applying at least a direct current electrical voltage between aid first and second electrodes, (d) stripping said photoresist from the layer of silicon oxide by placing said photoresist in an afterglow of an oxygen plasma, and (e) maintaining an electric field of said electrical voltage between said layer of silicon oxide and said plasma with said first and second electrodes in order to reduce contamination of said layer of silicon oxide by decelerating ions of said plasma.

2. A method according to claim 1, wherein the surface of said semiconductor substrate and said another surface of said semiconductor substrate are opposite surfaces.

3. A method according to claim 1 or claim 2, wherein said second electrode is formed from an electrically conducting wall of said processing chamber, said negative terminal being electrically connected to said conducting wall.

4. A method according to claim 3, wherein said electrical source has an electrical strength to produce said electric field at a field strength of the order of 4 to 8 MV/cm in said silicon oxide layer.

5. A method according to claim 4, wherein said electrical source is maintained on until after all plasma particles are removed from said processing chamber.

6. A method according to claim 3, wherein said electrical source is maintained on until after all plasma particles are removed from said processing chamber.

7. A method according to claim 1, wherein said electrical source has an electrical strength to produce said electric field at a field strength of the order of 4 to 8 MV/cm in said silicon oxide layer.

8. A method according to claim 1, wherein said electrical source is maintained on until after all plasma particles are removed from said processing chamber.

9. A method according to claim 1, wherein said step (c) is carried out by applying only a direct current voltage between said first and second electrodes.

10. A method according to claim 1, wherein said step (c) is carried out by applying a direct current voltage having a superimposed alternating voltage component between said first and second electrodes.

11. A method according to claim 1, wherein said step (c) is carried out by applying a direct current voltage that provides an increasing electrical field to said first and second electrodes.

* * * * *